(12) United States Patent
Li et al.

(10) Patent No.: US 6,921,691 B1
(45) Date of Patent: Jul. 26, 2005

(54) TRANSISTOR WITH DOPANT-BEARING METAL IN SOURCE AND DRAIN

(75) Inventors: Hong-Jyh Li, Austin, TX (US); Nirmal Chaudhary, Austin, TX (US)

(73) Assignee: Infineon Technologies AG, Munich (DE)

(*) Notice: Subject to any disclaimer, the term of this patent is extended or adjusted under 35 U.S.C. 154(b) by 42 days.

(21) Appl. No.: 10/803,645

(22) Filed: Mar. 18, 2004

(51) Int. Cl.$^7$ .......................................... H01L 21/8242
(52) U.S. Cl. .................. 438/249; 438/369; 438/542
(58) Field of Search .............................. 438/249, 369, 438/542

(56) References Cited

U.S. PATENT DOCUMENTS 5,162,263 A * 11/1992 Kunishima et al. ......... 438/535

OTHER PUBLICATIONS

Gannavaram, S. et al., "Low Temperature ($\leq$ 800° C) Recessed Junction Selective Silicon–Germanium Source/Drain Technology for sub–70 nm CMOS," 0-7803-6441-4/00, IEEE/North Carolina State University, Raleigh, NC, 2000.

Huang, F.J., et al., "Schottky–Clamped NMOS Transistors Implemented in a Conventional 0.8–$\mu$m CMOS Process," IEEE Electron Device Letters, Sep., 1998, pp. 326–328, vol. 19, No. 9, IEEE, New York, NY.

"Front End Processes," International Technology Roadmap for Semiconductor (ITRS), 2002 Update, pp. 45–62, http://member.itrs.net/.

"Front End Processes," International Technology Roadmap for Semiconductor (ITRS), 2003 Edition, pp. 23–25, http://member.itrs.net/.

* cited by examiner

Primary Examiner—Thien F Tran
(74) Attorney, Agent, or Firm—Slater & Matsil, L.L.P.

(57) ABSTRACT

A transistor and method of manufacturing thereof. A gate dielectric and gate are formed over a workpiece, and the source and drain regions of a transistor are recessed. The recesses are filled with a dopant-bearing metal, and a low-temperature anneal process is used to form doped regions within the workpiece adjacent the dopant-bearing metal regions. A transistor having a small effective oxide thickness and a well-controlled junction depth is formed.

29 Claims, 4 Drawing Sheets

TRANSISTOR WITH DOPANT-BEARING METAL IN SOURCE AND DRAIN

TECHNICAL FIELD

The present invention relates generally to semiconductor devices, and more particularly to a method of fabricating a transistor and a structure thereof.

BACKGROUND

Semiconductor devices are used in a variety of electronic applications, such as personal computers, cell phones, digital cameras, and other electronic equipment, as examples. A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

The gate dielectric for MOSFET devices has in the past typically comprised silicon dioxide. However, as devices are scaled down in size, silicon dioxide becomes a problem because of gate leakage current, which can degrade device performance. Therefore, there is a trend in the industry towards the development of the use of high dielectric constant (k) materials (e.g., having a dielectric constant of 3.9 or greater, for example) for use as the gate dielectric in MOSFET devices.

High k gate dielectric development has been identified as one of the grand challenges in the 2003 edition of International Technology Roadmap for Semiconductor (ITRS), incorporated herein by reference, which identifies the technological challenges and needs facing the semiconductor industry over the next 15 years. For low power logic (for portable electronic applications, for example), it is important to use devices having low leakage current, in order to extend battery life. Gate leakage current must be controlled in low power applications, as well as sub-threshold leakage, junction leakage, and band-to-band tunneling. For high performance (namely, speed) applications, it is important to have a low sheet resistance and a minimal effective gate oxide thickness.

To fully realize the benefits of transistor scaling, the gate oxide thickness needs to be scaled down to less than 2 nm. However, the resulting gate leakage current makes the use of such thin oxides impractical in many device applications where low standby power consumption is required. For this reason, the gate oxide dielectric material will eventually be replaced by an alternative dielectric material that has a higher dielectric constant. However, device performance using high k dielectric materials suffers from trapped charge in the dielectric layer, which deteriorates the mobility, making the drive current lower than in transistors having silicon dioxide gate oxides, thus reducing the speed and performance of transistors having high k gate dielectric materials.

FIG. 1 shows a cross-sectional view of a prior art semiconductor device 100 comprising a transistor with a high k gate dielectric material. The semiconductor device 100 includes field oxide regions 104 formed in a workpiece 102. The transistor includes a source S and a drain D that are separated by a channel region C. The transistor includes a gate dielectric 108 that comprises a high k insulating material. A gate 110 is formed over the gate dielectric 108, as shown.

After the gate 110 is formed, the source region S and drain region D are lightly doped, e.g., by a lightly doped drain (LDD) implant, to form extension regions 128 of the source S and drain D. Insulating spacers 112 are then formed along the sidewalls of the gate 110 and gate dielectric 108, and a source/drain implant is performed on exposed surfaces of the workpiece 102, followed by a high temperature thermal anneal, typically at temperatures of about 1000 to 1015° C., to form the source S and drain D.

One problem with the prior art semiconductor device 100 shown in FIG. 1 is that an interfacial oxide 114 is formed between the workpiece 102 and the high k dielectric 108, and an interfacial oxide 116 is formed between the high k dielectric 108 and the gate 110. The interfacial oxides 114 and 116 form because the workpiece 102 typically comprises silicon, which has a strong tendency to form silicon dioxide ($SiO_2$) in the presence of oxygen, during the deposition of the high k dielectric 108, for example, forming interfacial oxide 114. Likewise, the gate 110 often comprises polysilicon which also tends to form $SiO_2$ 116 on the top surface of the high k gate dielectric 108.

The source S and drain D regions of the semiconductor device 100 are formed by implanting ions of a dopant species, and annealing the workpiece 102 to cause diffusion of the dopant deep within the workpiece 102, forming the source S and drain D regions. One problem with the prior art structure 100 is that the high temperature anneal processes used to form the source S and drain D tend to degrade the dielectric constant of the high k gate dielectric 108. In particular, when exposed to a high temperature treatment, the interfacial oxides 114 and 116 have become thicker, increasing the effective oxide thickness (EOT) 118 evaluated electrically from the entire gate stack (the interfacial oxide 114, high k dielectric 108 and interfacial oxide 116) of the semiconductor device 100. Thus, by using a high k dielectric material for the gate dielectric 108, it can be difficult to decrease the gate dielectric 108 thickness to a dimension required for the transistor design, as devices 100 are scaled down in size.

Another problem with the prior art semiconductor device 100 shown in FIG. 1 is that by forming the source S and drain D using ion implantation, it is difficult to meet the reduced junction depth $X_j$ and sheet resistance $R_s$ that are required for advanced technologies. The thicker the junction depth $X_j$, the more the short channel effects such as the hot carrier effects become severe and degrade transistor reliability, causing source S and drain D leakage and/or punch-through. Furthermore, the device 100 has a high sheet resistance $R_s$, which degrades drive current and circuit speed, thus making the semiconductor device 100 less reliable for use in high-performance and/or high-speed applications.

Therefore, what is needed in the art is a transistor design and fabrication method, wherein the effective gate dielectric thickness, the junction depth, and the sheet resistance are reduced.

SUMMARY OF THE INVENTION

These and other problems are generally solved or circumvented, and technical advantages are generally achieved, by preferred embodiments of the present invention which includes a transistor having source and drain regions comprising a dopant-bearing metal. A low-temperature anneal process is used to cause diffusion of dopants in the dopant-bearing metal into the workpiece adjacent the dopant-bearing metal, forming doped regions. The doped regions and the dopant-bearing metal comprise the source and drain of the transistor. Because a low-temperature anneal process is used to form the doped regions, the effective oxide thickness of the gate dielectric is not substantially increased during the low-temperature anneal, resulting in a thinner effective gate dielectric (or oxide) thickness. Furthermore, the low-temperature anneal results in a reduced junction depth.

In accordance with a preferred embodiment of the present invention, a transistor includes a source and a drain disposed in a workpiece, the workpiece having a top surface, the source and drain being separated by a channel region. The source and drain each comprise a dopant-bearing metal region disposed within the top surface of the workpiece. A doped region is disposed in the workpiece adjacent each dopant-bearing metal region. A gate dielectric is disposed over the channel region and a portion of the source and the drain. A gate is disposed over the gate dielectric.

In accordance with another preferred embodiment of the present invention, a transistor includes a source disposed in a workpiece, the workpiece having a top surface. The source includes a first dopant-bearing metal region disposed within the top surface of the workpiece, and a first doped region disposed in the workpiece adjacent the first dopant-bearing metal region. A drain is disposed in the workpiece, the drain being separated from the source by a channel region. The drain comprises a second dopant-bearing metal region disposed within the top surface of the workpiece and a second doped region disposed in the workpiece adjacent the second dopant-bearing metal region. A gate dielectric is disposed over the channel region and a portion of the source and the drain. A gate is disposed over the gate dielectric.

In accordance. with yet another preferred embodiment of the present invention, a method of fabricating a transistor includes providing a workpiece, depositing a gate dielectric material over the workpiece, and depositing a gate material over the gate dielectric material. The gate material and the gate dielectric material are patterned to form a gate and a gate dielectric over a channel region of the workpiece. A first recess is formed in a source region of the workpiece, and a second recess is formed in a drain region of the workpiece. The source region and the drain region are proximate and separated by the channel region. The method includes filling the first recess and the second recess with a dopant-bearing metal, and annealing the workpiece to cause diffusion of a dopant of the dopant-bearing metal into the workpiece, forming a doped region within the workpiece adjacent the dopant-bearing metal in the source region and the drain region.

Advantages of preferred embodiments of the present invention include providing a transistor design and manufacturing method thereof, wherein the total anneal temperature for the transistor manufacturing process flow is reduced, reducing the thermal budget and improving the gate dielectric quality. The sheet resistance in the source and drain extension region is extremely low, and the junction depth can be well-controlled because of the recess formation process. Junctions with abrupt edges may be formed in the source and drain regions. Because the doped regions beneath the dopant-bearing metal regions are formed at a low temperature, the dopant diffuses less into the workpiece, creating a thinner junction depth, reduced sheet resistance, and reduced effective gate oxide thickness.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a transistor formed on a semiconductor device. The invention may also be applied, however, to MOSFETs or other transistor devices, including p channel metal oxide semiconductor (PMOS) transistors, n channel metal oxide semiconductor (NMOS) transistors, and/or complimentary metal oxide semiconductor (CMOS) devices, as examples. Only one transistor is shown in each of the figures; however, there may be many other transistors and devices formed in the manufacturing process for the semiconductor devices shown.

Figure 1:
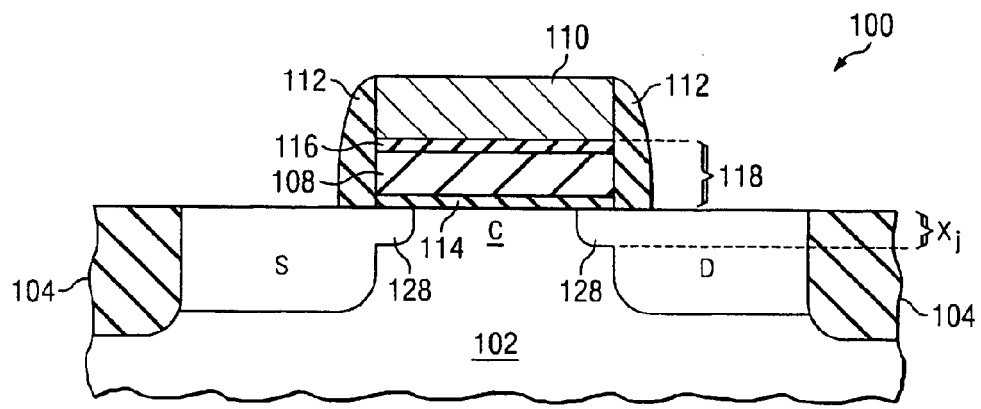
FIG. 1 shows a cross-sectional view of a prior art transistor.
Figure 2:
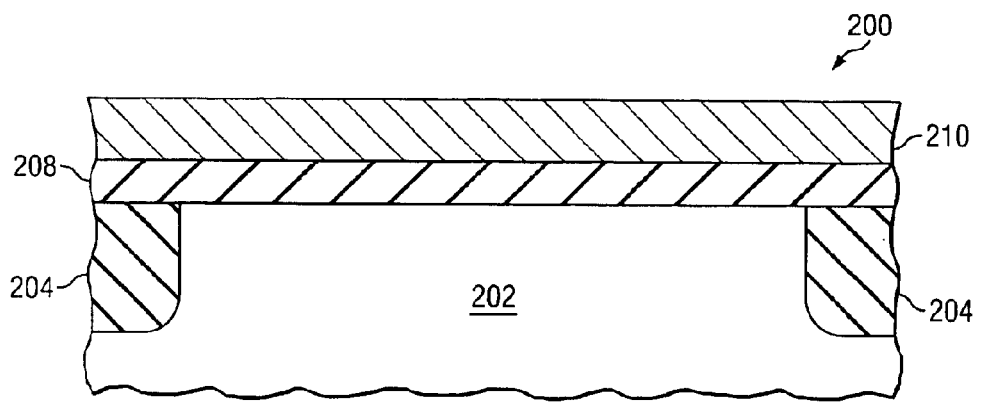
FIGS. 2 through 8 show cross-sectional views of a transistor at various stages of manufacturing in accordance with a preferred embodiment of the present invention, wherein source and drain regions are recessed and then filled with a dopant-bearing metal, followed by a low temperature anneal process.

FIGS. 2 through 8 show cross-sectional views of a preferred embodiment of the present invention at various stages of manufacturing. Referring first to FIG. 2, a semiconductor device 200 comprises a workpiece 202. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, Si/Ge, or SiC, as examples, may be used in place of silicon. The workpiece 202 may also comprise a silicon-on-insulator (SOI) substrate, for example.

The workpiece 202 may be lightly doped (not shown). In general, the workpiece is doped with the either N or P type dopants, depending on whether the junctions of the transistor will be P or N type, respectively. For example, if the transistors to be manufactured comprise PMOS transistors, the workpiece 202 may be lightly doped with N type dopants. Or, if NMOS transistors will be formed, the workpiece 202 may be lightly doped with P type dopants.

Isolation regions 204 may be formed in various locations on the workpiece 202, as shown. The isolation regions 204 may comprise shallow trench isolation (STI) regions or field oxide regions that are disposed on either side of a channel region C of a transistor 230 (not shown in FIG. 2; see FIG. 8), for example. The isolation regions 204 may be formed by depositing a photoresist over the workpiece 202, not shown. The photoresist may be patterned using lithography techniques, and the photoresist may be used as a mask while the workpiece 202 is etched to form holes or patterns for the isolation regions 204 in a top surface of the workpiece 202. An insulator such as an oxide, for example, may be deposited over the workpiece 202 to fill the patterns, forming isolation regions 204. Alternatively, the isolation regions 204 may be formed by other methods, for example.

Note that if PMOS and NMOS transistors (not shown) are to be manufactured on the same workpiece 202, the workpiece 202 may be lightly doped with P type dopants, the NMOS portions of the workpiece 202 may be masked, and well implants may then be formed to create N wells for the PMOS devices. P type implants may then be implanted into the NMOS portions.

A gate dielectric material 208 is deposited over the workpiece 202, as shown in FIG. 2. The gate dielectric material 208 may comprise traditional insulating materials used for gate dielectrics, such as silicon dioxide ($SiO_2$), silicon nitride ($Si_xN_y$) or silicon oxynitride (SiON). However, embodiments of the present invention are particularly advantageous when a high k material is used for the gate dielectric material 208. Thus, in one embodiment, the gate dielectric material 208 preferably comprises a high dielectric constant material, such as $HfO_2$, $HfSiO_x$, $Al_2O_3$, $ZrO_2$, $ZrSiO_x$, $Ta_2O_5$, or $La_2O_3$, as examples, although alternatively, the gate dielectric material 208 may comprise other low k or high k insulating materials.

The gate dielectric material 208 may comprise a single layer of material, or alternatively, the gate dielectric material 208 may comprise two or more layers. In one embodiment, one or more of these materials can be included in the gate dielectric material 208 in different combinations or in stacked layers. The gate dielectric material 208 may be deposited by chemical vapor deposition (CVD), atomic layer deposition (ALD), metal organic chemical vapor deposition (MOCVD), physical vapor deposition (PVD), jet vapor deposition (JVP), as examples, although alternatively, the gate dielectric material 208 may be deposited using other suitable deposition techniques. The gate dielectric material 208 preferably comprises a thickness of about 10 Å to about 60 Å in one embodiment, although alternatively, the gate dielectric material 208 may comprise other dimensions, such as 80 Å or less, as an example. The workpiece 202 may optionally be exposed to a pre-gate treatment (not shown) such as a HF, HCl or ozone based cleaning treatment, as examples, before depositing the gate dielectric material 208.

A gate material 210 is deposited over the gate dielectric material 208. The gate material 210 preferably comprises a conductor, such as a metal or polysilicon, although alternatively, other conductive and semiconductive materials may be used for the gate material 210. For example, the gate material 210 may comprise TiN, HfN, TaN, a fully silicided gate material (FUSI), or other metals, as examples. The gate material 210 may comprise a plurality of stacked gate materials, such as a metal underlayer with a polysilicon cap layer disposed over the metal underlayer, or a combination of a plurality of metal layers that form a gate electrode stack. Alternatively, in another embodiment, the gate material 210 may comprise polysilicon or other semiconductor materials. The gate material 210 may be deposited using CVD, PVD, ALD, or other deposition techniques, as examples.

Figure 3:
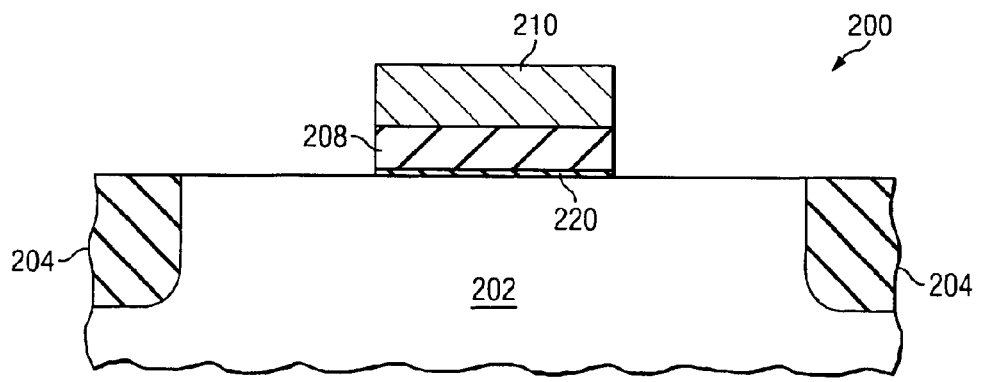

The gate material 210 and the gate dielectric material 208 are patterned using a lithography technique to form a gate 210 and a gate dielectric 208 of a transistor, as shown in FIG. 3. For example, a photoresist (not shown) may be deposited over the workpiece 202. The photoresist may be patterned with a desired pattern for the gate and gate dielectric, and the photoresist may be used as a mask while the gate material 210 and the gate dielectric material 208 are etched to form the gate material 210 and gate dielectric material 208 into the desired pattern. The photoresist is then stripped or removed.

Note that a thin interfacial layer 220 is likely to be formed during the deposition of the gate dielectric material 208, or during a cleaning treatment such as a wet pre-clean, prior to the gate dielectric material 208 deposition, as examples. This thin interfacial layer 220 typically comprises a thickness of about 7 Å or less. The thin interfacial layer 220 forms by the reaction of silicon or other semiconductor material in the workpiece 202 with an oxide in the gate dielectric material 208 or pre-clean process.

Figure 4:
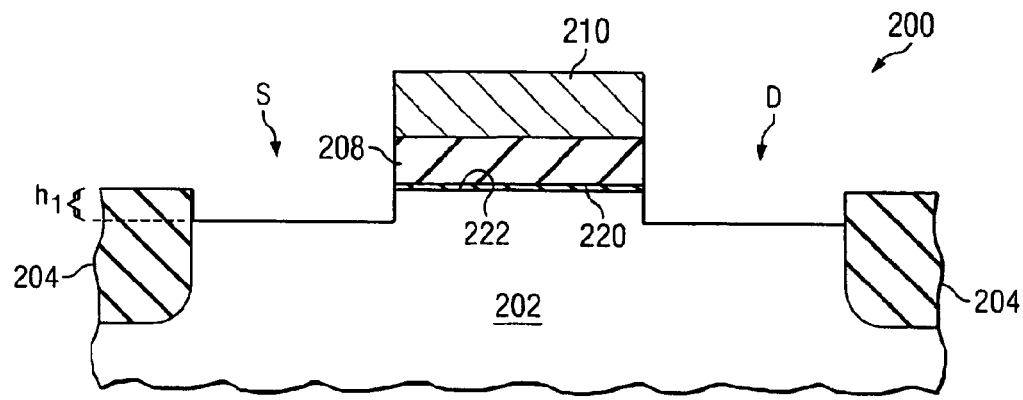

Next, in accordance with a preferred embodiment of the present invention, the workpiece 202 is recessed in the source S and drain D regions, as shown in FIG. 4. The source S region and drain D region may be recessed using a dry etch process containing argon as an example, although alternatively, other etch chemistries may also be used to form the recesses. The etch process in one embodiment is preferably anisotropic, to avoid reducing the horizontal dimensions (e.g., lateral etching) of the gate 210 and the gate dielectric 208, for example. Alternatively, the etch process to create the recesses may comprise an isotropic etch, such as an etch process referred to as "chemical downstream etching," which is a technique employing microwave plasma source, low bias RF power, or a combination of both, for isotropic recessing of silicon in the workpiece 202 selective to the isolation oxide 204, as an example, although other isotropic etch processes may alternatively be used. The depth $h_1$ of the recesses in the source S and drain D regions preferably comprises about 200 Å or less below the top surface 222 of the workpiece 202, as an example. Preferably, the source S region and the drain D region are recessed in a single processing step, e.g., they are recessed at the same time. The source S region and drain D region may be recessed using an additional separate etch process, or alternatively, the source S region and the drain D region may be recessed during the gate 210 and gate dielectric 208 patterning process, for example.

Figure 5:
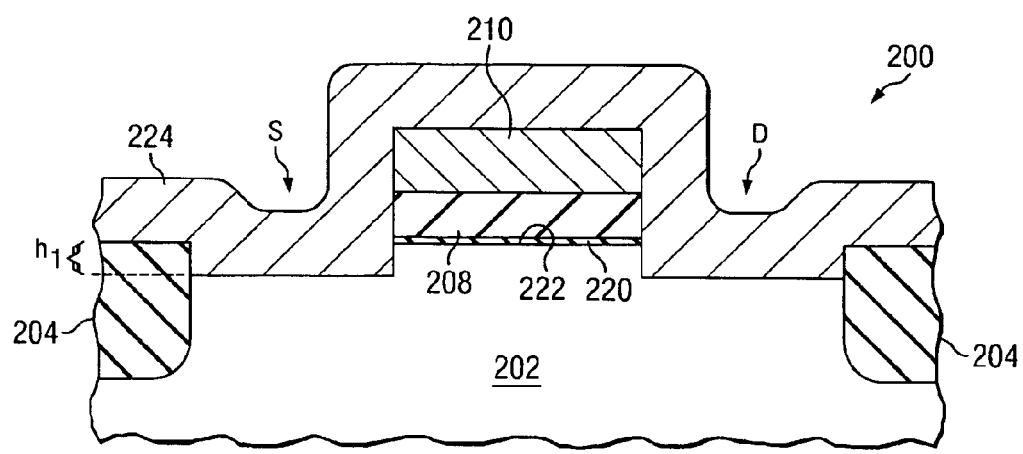
Figure 6:
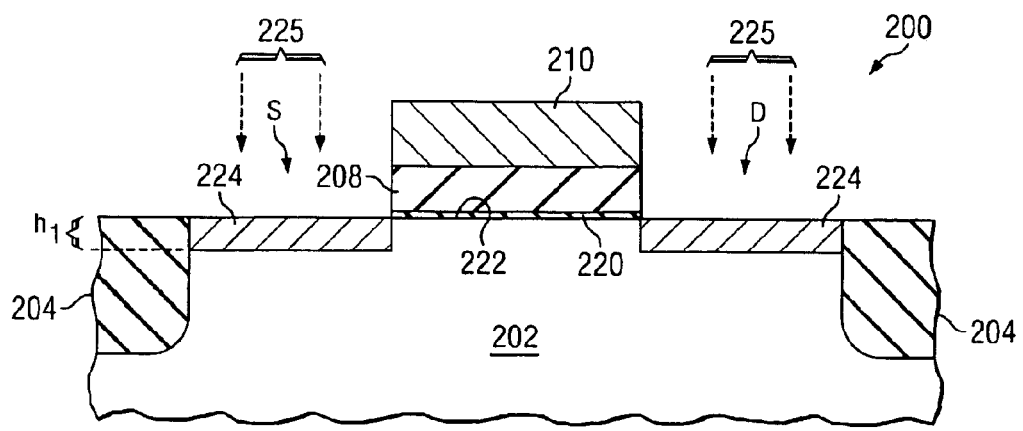

A dopant-bearing metal 224 is deposited over exposed portions of the workpiece 202, the top surface of the gate 210, and isolation regions 204, as shown in FIG. 5. The dopant-bearing metal 224 preferably comprises a metal that includes a dopant such as boron (B), phosphorous (P), arsenic (As), or antimony (Sb), as examples, although alternatively, the dopant may comprise other dopant materials. The dopant-bearing metal 224 preferably comprises $TiB_2$, $ZrB_2$, $HfB_2$, $ZrP$, $TiP$, $ZrSb_2$, $TiSb_2$, $HfSb_2$, or arsinides of Zr or Hf, as examples, although alternatively, the dopant-bearing metal 224 may comprise other metals containing a dopant.

The metal portion (e.g., Ti, Zr, Hf) of the dopant-bearing metal 224 causes the source S and drain D to have a lower sheet resistance $R_s$, and the dopant portion (e.g., B, P, Sb, As) creates the junction of the source S and drain D. Preferably, in accordance with embodiments of the present invention, the dopant-bearing metal 224 is selected to provide a reduced sheet resistance $R_s$ for the semiconductor device 200.

The recesses in the source S and drain D regions are preferably back-filled with the dopant-bearing metal 224. For example, the dopant-bearing metal 224 may be deposited using electron beam evaporation, CVD, or physical vapor deposition, although alternatively, other methods of deposition may be used to deposit the dopant-bearing metal 224.

The dopant-bearing metal 224 may be substantially conformal when deposited, as shown in FIG. 5. Excess portions of the dopant-bearing metal 224 are removed from over the isolation regions 204, gate 210 top surface and sidewalls, and sidewalls of the gate dielectric 208, leaving the structure shown in FIG. 6. The excess portions of the dopant-bearing metal 224 may be removed using an anisotropic etch process or an isotropic etch process. As examples, the excess portions may be removed using wet, dry, electrochemical or chemical etch processes, although other etch processes may alternatively be used. The top surface of the dopant-bearing metal regions 224 formed in the source S and drain D regions may be substantially planar with the top surface 222 of the workpiece 202, as shown, although alternatively, the dopant-bearing metal regions 224 may be slightly recessed or concaved slightly within the recesses of the workpiece 202 (not shown).

In one embodiment, at this stage of manufacturing, the dopant-bearing metal regions 224 may be doped using ion implantation. This is an optional step that is not required in embodiments of the present invention but may be appropriate for some transistor designs. In this optional step, dopant ions 225 are introduced into the dopant-bearing metal regions 224 using ion implantation. This increases the dopant concentration in the dopant-bearing metal regions 224, resulting in an increase in dopant concentration of the underlying dopant region (not shown in FIG. 6: see FIG. 7 at 226) during the diffusion of the dopant of the dopant-bearing metal regions 224 into the underlying substrate 202 in subsequent processing steps. When this optional ion implantation step is included in the manufacturing process, preferably, the implantation is performed at an energy level of about 1 KeV or below at an implantation dose of about $1 \times 10^{15}$ ions/cm$^2$ or less, as examples.

Figure 7:
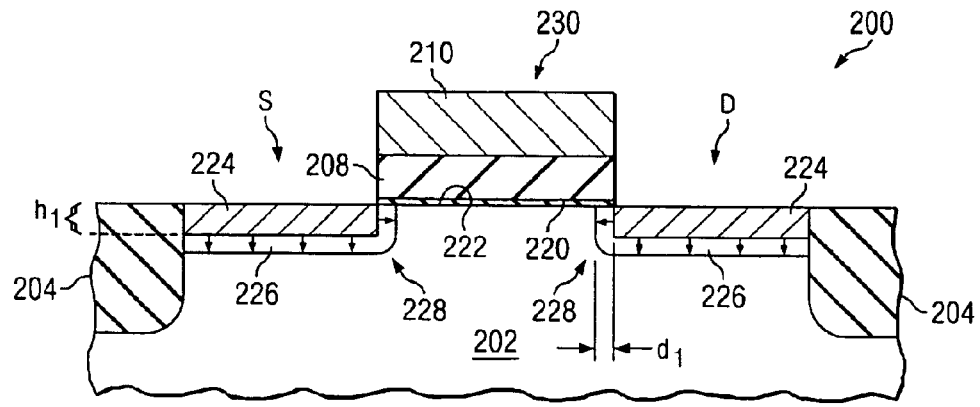

The workpiece 202 is then subjected to a low-temperature anneal process to cause out-diffusion of dopants in the dopant-bearing metal regions 224 and form a doped region 226 in each of the source S region and drain D region within the workpiece 202 adjacent the dopant-bearing metal regions 224, as shown in FIG. 7. The doped region 226 extends beneath the dopant-bearing metal regions 224 and also extends laterally (to the side of the dopant-bearing metal regions) beneath the gate 210 and gate dielectric 208 by about 70 Å or less, as shown at 228. The low-temperature anneal process preferably comprises a temperature of about 900° C. or less for about 1 hour or less, and more preferably comprises a temperature of about 900° C. for about 20 minutes or less, as examples. The doped regions 226 preferably comprise a thickness of about 100 Å or less.

Thus, the source S and the drain D each comprise a dopant-bearing metal 224 and a doped region 226 disposed adjacent (namely, below and extending laterally from) the dopant-bearing metal 224, as shown. The source S and drain D preferably comprise a total thickness of about 300 Å below the top surface 222 of the workpiece 202.

Note that the doped region 226 includes an extension region 228 that extends beneath the gate dielectric 208 and extends towards the channel region C. One advantage of the transistor 230 formed in accordance with embodiments of the present invention is that the extension region 228 can be made smaller than in traditional transistor designs. For example, the extension region 228 may extend beneath the gate 210 on either side by a distance $d_1$, which may comprise about 70 Å or less, e.g., about 20 to about 50 Å. This is advantageous because the resistance of the extension region 228 is low, resulting from the reduced amount of overlap $d_1$, which reduces hot carrier effects of the transistor 230.

In one embodiment, the dopant-bearing metal 224 comprises a higher atomic percentage of the dopant than would be found in a natural state of the dopant-bearing metal 224, and the percentage of the dopant in the dopant-bearing metal 224 is reduced after the low-temperature anneal, resulting from dopant ions diffusing into the workpiece 202 to form the doped regions 226. For example, if the dopant-bearing metal 224 comprises Ti bearing the dopant B, the dopant-bearing metal 224 may comprise $TiB_x$, where x>2, e.g., 3, 4, etc. In this embodiment, after the low temperature anneal to form the doped regions 226, the dopant-bearing metal 224 comprises a reduced atomic percentage of the dopant, and may comprise, for example, $TiB_2$. Note that while there is less of the dopant species left residing in the dopant-bearing metal 224 after the low-temperature anneal because some dopant atoms migrate to the dopant region 226, some dopant species are still left residing in the dopant-bearing metal 224.

Figure 8:
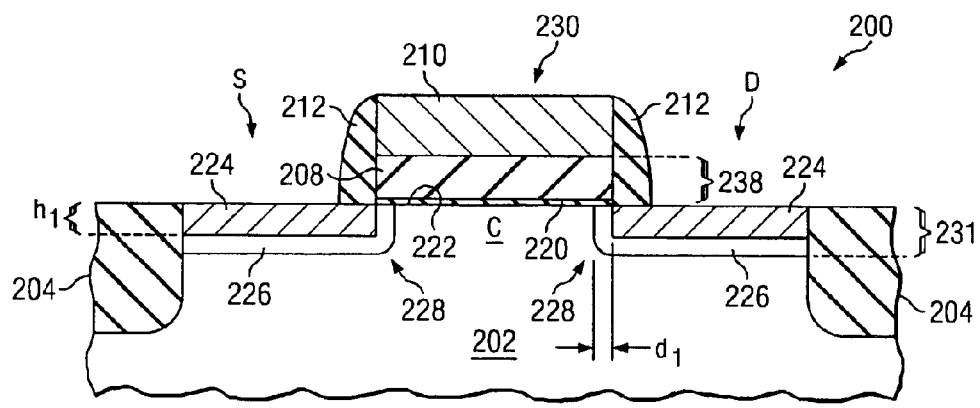

The manufacturing process for the device 200 is then continued to complete the device 200, preferably without subjecting the semiconductor device 200 to high temperatures, e.g., preferably without exposing the semiconductor device 200 to a temperature greater than about 900° C. For example, a spacer material 212 comprising a dielectric material such as $SiO_2$, SiN, or SiON, as examples, although other insulating materials may also be used, may be deposited over exposed portions of the workpiece 202. The sidewall spacer 212 material may be exposed to an etch process such as an anisotropic etch to form sidewall spacers 212, as shown in FIG. 8.

Thus, in accordance with an embodiment of the invention, a transistor 230 is formed that includes a gate 210, a source S and a drain D, wherein the source S and drain D comprise the dopant-bearing metal regions 224 and the doped regions 226. The transistor device 230 has a thin effective oxide thickness 238 which includes the interfacial layer 220 and the gate dielectric 208. Advantageously, because the transistor 230 is not exposed to a high-temperature anneal process, e.g., at temperatures of 1000° C. or more, increasing the thickness of the interfacial layer 220 is avoided, thus decreasing the effective oxide thickness 238. For example, the interfacial layer 220 preferably comprises a thickness of about 2 Å to about 7 Å, and more preferably comprises a thickness of about 7 Å or less. Furthermore, because a low-temperature anneal is used to form the doped regions 226 of the source S and drain D, this results in a shallower junction depth 231 of the transistor device 230. The transistor 230 is particularly advantageous in applications wherein a high drive current and minimal effective oxide thickness are important, such as in high performance (e.g., high speed) applications, for example, in use with memory and other devices.

Figure 9:
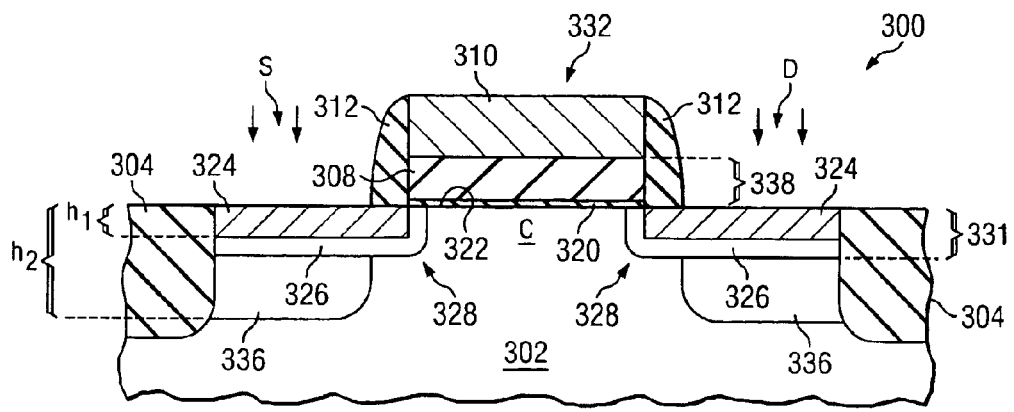
FIG. 9 shows a cross-sectional view of an embodiment of the present invention, wherein deep source and drain regions are formed by ion implantation and a thermal anneal, after forming the dopant-bearing metal source and drain regions.

FIG. 9 shows an embodiment of the present invention, in which a similar process flow may be used as was described for FIGS. 2 through 8. Similar reference numbers are designated for the various elements in FIG. 9 as were used in FIGS. 2 through 8. To avoid repetition, each reference number shown in the figure is not described in detail herein. Rather, similar materials and thicknesses described for x02, x04, etc. . . . are preferably used for the material layers shown as were described for FIGS. 2 through 8, where x=2 in FIGS. 2 through 8 and x=3 in FIG. 9. As an example, the preferred and alternative materials listed for the dopant-bearing metal 224 in the description for FIGS. 2 through 8 are preferably also used for the dopant-bearing metal 324 in FIG. 9.

In the embodiment shown in FIG. 9, after the sidewall spacers 312 are formed over the sidewalls of the gate 310 and the gate dielectric 308, an ion implantation process is used, followed by a high temperature anneal process, at a temperature of about 1000° C. or more, to form deep source and drain regions 336 in the source S and drain D regions, as shown. The target depth of this optional ion implantation process is preferably greater than the depth of the dopant bearing metal 324 and doped region 326, in one embodiment, as an example. The deep source and drain regions 336 may comprise a depth $h_2$ of about 500 Å or greater beneath the workpiece top surface 322, for example. If the transistor 332 comprises a PMOS transistor, $BF_2$, and if the transistor 332 comprises an NMOS transistor, As, may be implanted at an energy level of about 10 KeV at an implantation dosage of about $1 \times 10^5$ ions/$cm^2$, as examples.

In the embodiment shown in FIG. 9, the resulting transistor 332 may have a thicker interfacial oxide 320 than the interfacial oxide 220 of FIG. 8, and may also have an additional interfacial oxide formed between the gate dielectric 308 and the gate 310 (not shown), yet the transistor 332 benefits from a reduced sheet resistance $R_s$ due to the presence of the dopant-bearing metal 324 of the source S and drain D. This transistor 332 is advantageous in some transistor 332 applications that require a deeper source S and drain D implant to prevent junction leakage current from the source S and drain D to the workpiece 302, such as in low power applications. In these applications, a higher effective oxide thickness does not deleteriously affect the transistor 332 performance.

Figure 10:
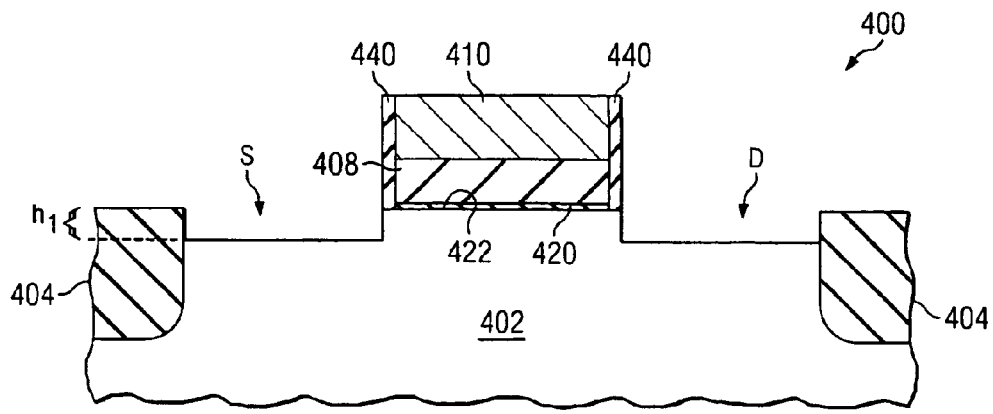
FIGS. 10 and 11 show cross-sectional views of another embodiment of the present invention, wherein a sidewall spacer is formed over sidewalls of the gate dielectric and gate before forming the recess for the dopant-bearing metal.
Figure 11:
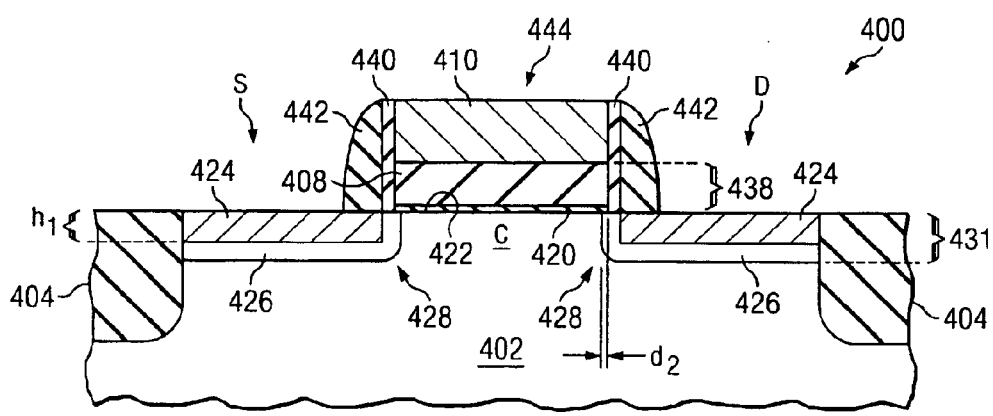
Figure 12:
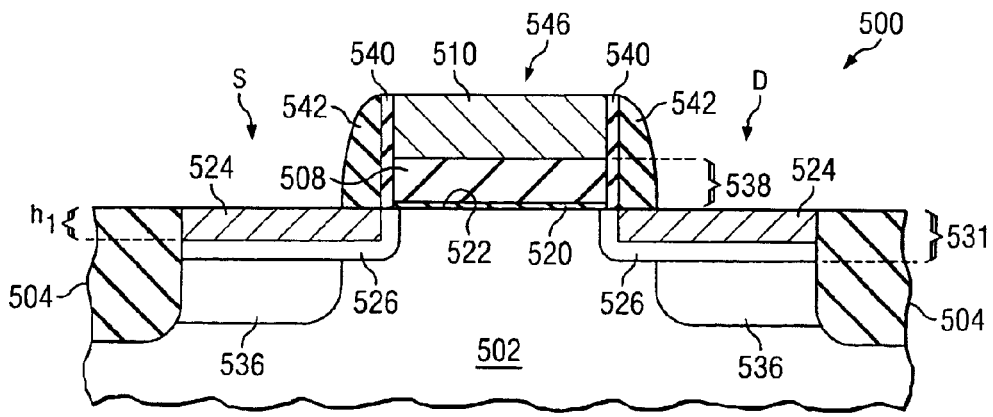
FIG. 12 shows a cross-sectional view of an embodiment of the present invention, wherein a sidewall spacer is formed before forming the recess in the source and drain regions, and deep source and drain regions are also formed, as shown in the embodiment of FIG. 9.

FIGS. 10–11 and 12 show additional preferred embodiments of the present invention, in which a double spacer is used adjacent the gate dielectric and gate, along the sidewalls. A similar process flow and structure may be used as was described for FIGS. 2 through 8, and 9 for the embodiments shown in FIGS. 10–11 and 12. Similar reference numbers are designated for the various elements in FIGS. 10–11 and 12 as were used in FIGS. 2 through 8 and 9. Again, to avoid repetition, each reference number shown in the figure is not described in detail herein. Rather, similar materials and thicknesses described for x02, x04, etc. . . . are preferably used for the material layers shown as were described for FIGS. 2 through 8 and 9, where x=2 in FIGS. 2 through 8, x=3 in FIG. 9, x=4 in FIGS. 10–11, and x=5 in FIG. 12.

FIGS. 10 and 11 show cross-sectional views of another preferred embodiment of the present invention, wherein a first spacer 440 is formed over the sidewalls of the gate 410 and gate dielectric 408 before forming a recess in the source S and drain D regions. The first spacers 440 preferably comprise a thickness of about 50 Å or less, and may comprise an insulating material such as $SiO_2$, SiN, or SiON, as examples. Similar manufacturing processes and materials are used as were described for the embodiment shown in FIGS. 4 through 8, resulting in the transistor 444 shown in FIG. 11 in a cross-sectional view. A second spacer 442 is formed adjacent and abutting the first spacers 440, as shown, after the formation of the source S and drain D regions as described herein. Again, the transistor 444 has a decreased effective oxide thickness 438 of the gate dielectric 408, and has a junction depth 431 that is well-controlled and very shallow. This embodiment is advantageous in that the extension regions 428 of the source S and drain D are further reduced, extending a distance $d_2$ of about 50 Å or less beneath the edge of the gate 410 and gate dielectric 408, as shown.

FIG. 12 shows an embodiment of the present invention, wherein a first spacer 540 and second spacer 542 are used, as described for FIG. 11. In addition, the workpiece 502 is subjected to a subsequent ion implantation process to form deep source and drain regions 536 in the source S and drain D, as described with reference to the embodiment shown in FIG. 9. This results in a transistor 546, as shown, having deep source and drain regions 536 and also including a first spacer 540 and a second spacer 542 disposed on either side of the gate 510 and gate dielectric 508. As described with reference to FIG. 9, the relatively high anneal temperatures required to form the deep source and drain regions 536 result in an increased EOT, but this does not present a problem in some applications. The transistor 546 has a decreased sheet resistance $R_s$ and a decreased junction depth 531.

Advantages of preferred embodiments of the present invention include providing transistor designs 230, 332, 444, and 546 and methods of manufacture thereof, having source S and drain D regions comprising a dopant-bearing metal 224, 324, 424, 524. Dopants are diffused in a low-temperature anneal process to a region beneath the dopant-bearing metal 224, 324, 424, 524, forming doped regions 226, 326, 426, 526. The doped regions 226, 326, 426, 526 and the dopant-bearing metal 224, 324, 424, 524 comprise the source S and drain D of the transistors 230, 332, 444, and 546. Metals have a lower sheet resistance than other materials used in semiconductor manufacturing, generally. Thus, using a metal in the source S and drain D region results in a lower sheet resistance $R_s$ in the extension regions 228, 328, 428, 528 for the transistors 230, 332, 444, and 546 described herein.

Because a low-temperature anneal process is used to form the doped regions 226, 326, 426, 526, the effective oxide thickness of the gate dielectric is not substantially increased during the low-temperature anneal process used to form the doped regions 226, 326, 426, 526, resulting in a thinner effective gate dielectric thickness (or effective oxide thickness (EOT)), which comprises the total thickness of the thin interfacial oxide and gate dielectric 220/208 or 420/408. Furthermore, the junction depth 231, 331, 431, 531 may be reduced by embodiments of the present invention due to the etch process used to create the recess for the dopant-bearing metal 224, 324, 424, 524, which are well-controlled. Hot carrier effects are also reduced, due to the reduced distance that the extension region 228, 328, 428, 528 of the source S and drain D extends beneath the gate 210, 310, 410, 510. The transistors described herein benefit from a reduced thermal budget and improved gate quality.

Again, only one transistor is shown in each figure. However, a plurality of transistors may be formed simultaneously in accordance with embodiments of the present invention, not shown. Furthermore, PMOS and NMOS transistors may be fabricated on a single workpiece, by masking portions of the workpiece while other portions are processed.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a transistor, the method comprising:

providing a workpiece;

depositing a gate dielectric material over the workpiece;

depositing a gate material over the gate dielectric material;

patterning the gate material and the gate dielectric material to form a gate and a gate dielectric over a channel region of the workpiece;

forming a first recess in a source region of the workpiece and a second recess in a drain region of the workpiece, the source region and the drain region being separated by the channel region;

filling the first recess and the second recess with a dopant-bearing metal; and annealing the workpiece to cause diffusion of a dopant of the dopant-bearing metal into the workpiece and form a doped region within the workpiece adjacent the dopant-bearing metal in the source region and the drain region.

2. The method according to claim 1, wherein annealing the workpiece comprises a temperature of about 900° C. or less for about 1 hour or less.

3. The method according to claim 1, wherein the gate dielectric comprises sidewalls, wherein filling the first recess and the second recess with the dopant-bearing metal comprises:

depositing the dopant-bearing metal over the first recess, the second recess, the gate, and the sidewalls of the gate dielectric; and removing the dopant-bearing metal from over the gate and sidewalls of the gate dielectric, leaving the dopant-bearing metal in the first recess and the second recess.

4. The method according to claim 1, wherein forming the first recess and the second recess comprise a single patterning step.

5. The method according to claim 1, wherein depositing the gate dielectric material comprises depositing $HfO_2$, $HfSiO_x$, $Al_2O_3$, $ZrO_2$, $ZrSiO_x$, $Ta_2O_5$, $La_2O_3$, $SiO_2$, $Si_xN_y$, SiON, or combinations thereof.

6. The method according to claim 1, wherein forming the first recess and the second recess comprise forming recesses having a depth of about 200 Å or less.

7. The method according to claim 6, wherein filling the first recess and the second recess with a dopant-bearing metal comprises filling the first recess and the second recess with $TiB_2$, $ZrB_2$, $HfB_2$, $ZrP$, $TiP$, $ZrSb_2$, $TiSb_2$, $HfSb_2$, or arsinides of Zr or Hf.

8. The method according to claim 1, wherein the gate and the gate dielectric comprise sidewalls, further comprising forming a first spacer on the sidewalls of the gate and the gate dielectric, before forming the first recess and the second recess.

9. The method according to claim 8, wherein forming the first spacer comprises forming a spacer comprising a width of about 20 Å to about 70 Å.

10. The method according to claim 8, further comprising implanting ions of a dopant into the source region and the drain region, after forming at least the first spacer, and annealing the workpiece to form deep implantation regions in the source region and the drain regions beneath the doped regions.

11. The method according to claim 8, wherein the first spacer comprises sidewalls, further comprising forming a second spacer over the sidewalls of the first spacer, after annealing the workpiece.

12. The method according to claim 11, further comprising implanting ions of a dopant into the source region and the drain region, after forming the second spacer, and annealing the workpiece to form deep implantation regions in the source region and the drain regions beneath the doped regions.

13. A method of forming a transistor, the method comprising:

providing a semiconductor body;

forming a gate dielectric over a channel region that is located in the semiconductor body;

a gate disposed over the gate dielectric; and forming a source and a drain in a semiconductor body so that the source and drain are separated by the channel region, wherein the source and drain each comprise a dopant-bearing metal region disposed within a top surface of the semiconductor body and a doped region disposed in the semiconductor body adjacent the dopant-bearing metal region.

14. The method of claim 13, wherein the dopant-bearing metal regions comprise a thickness of about 200 Å or less.

15. The method of claim 13, wherein the dopant-bearing metal regions comprise a at least one material selected from the group consisting of $TiB_2$, $ZrB_2$, $HfB_2$, ZrP, TiP, $ZrSb_2$, $TiSb_2$, $HfSb_2$, an arsenide of Zr, and an arsenide of Hf.

16. The method of claim 13, wherein forming a source and a drain comprise forming a region that includes boron.

17. The method of claim 13, wherein forming a source and a drain comprise forming a region that includes phosphorus.

18. The method of claim 13, wherein forming a source and a drain comprise forming a region that includes arsenic.

19. The method of claim 13, wherein forming a source and a drain comprise forming a region that includes antimony.

20. The method of claim 13, wherein forming the source and the drain comprises performing a deep implantation.

21. The method of claim 13, wherein forming a gate dielectric comprises forming a layer of a high dielectric constant material.

22. The method of claim 21, wherein the high dielectric constant material comprises $HfO_2$, $HfSiO_x$, $Al_2O_3$, $ZrO_2$, $ZrSiO_x$, $Ta_2O_5$, $La_2O_3$ or combinations thereof.

23. A method of fabricating a transistor, the method comprising:

providing a semiconductor body;

depositing a gate dielectric material over the semiconductor body;

depositing a gate material over the gate dielectric material;

patterning the gate material and the gate dielectric material to form a gate and a gate dielectric over a channel region of the semiconductor body;

depositing a dopant-bearing metal over the semiconductor body in regions adjacent the gate; and annealing the workpiece to cause diffusion of a dopant of the dopant-bearing metal into the semiconductor body.

24. The method of claim 23 wherein the dopant-bearing comprises at least one material selected from the group consisting of $TiB_2$, $ZrB_2$, and $HfB_2$.

25. The method of claim 23 wherein the dopant-bearing comprises at least one material selected from the group consisting of ZrP and TiP.

26. The method of claim 23 wherein the dopant-bearing comprises at least one material selected from the group consisting of $ZrSb_2$, $TiSb_2$, and $HfSb_2$.

27. The method of claim 23 wherein the dopant-bearing comprises an arsenide of Zr or an arsenide of Hf.

28. The method of claim 23 wherein depositing a gate dielectric material comprises depositing a high dielectric constant material.

29. The method of claim 28 wherein depositing a gate material comprises depositing a metal.

* * * * *